(12) United States Patent
Omura et al.

(10) Patent No.: US 10,411,111 B2
(45) Date of Patent: Sep. 10, 2019

(54) METHOD FOR FABRICATING HIGH-VOLTAGE INSULATED GATE TYPE BIPOLAR SEMICONDUCTOR DEVICE

(71) Applicant: KYUSHU INSTITUTE OF TECHNOLOGY, Fukuoka (JP)

(72) Inventors: Ichiro Omura, Fukuoka (JP); Masahiro Tanaka, Fukuoka (JP); Masanori Tsukuda, Fukuoka (JP); Yamato Miki, Fukuoka (JP)

(73) Assignee: KYUSHU INSTITUTE OF TECHNOLOGY, Fukuoka (JP)

( * ) Notice: Subject to any disclaimer, the term of this patent is extended or adjusted under 35 U.S.C. 154(b) by 0 days.

(21) Appl. No.: 15/860,422

(22) Filed: Jan. 2, 2018

(65) Prior Publication Data

US 2018/0145147 A1   May 24, 2018

Related U.S. Application Data

(63) Continuation-in-part of application No. 14/404,914, filed as application No. PCT/JP2013/064943 on May 29, 2013.

(30) Foreign Application Priority Data

May 30, 2012 (JP) ................................ 2012-123462
Sep. 5, 2012 (JP) ................................ 2012-195347

(51) Int. Cl.
*H01L 29/66* (2006.01)
*H01L 21/336* (2006.01)
(Continued)

(52) U.S. Cl.
CPC .. *H01L 29/66348* (2013.01); *H01L 21/26513* (2013.01); *H01L 21/28035* (2013.01);
(Continued)

(58) Field of Classification Search
CPC ........... H01L 29/7397; H01L 29/66348; H01L 29/7396
(Continued)

(56) References Cited

U.S. PATENT DOCUMENTS 5,329,142 A * 7/1994 Kitagawa ............ H01L 29/7394
257/137
5,751,024 A * 5/1998 Takahashi ......... H01L 29/66348
257/139
(Continued)

FOREIGN PATENT DOCUMENTS

DE   102005004354 A1   8/2006
DE   112007000270 T5   12/2008

OTHER PUBLICATIONS

Office Action issued in counterpart German Patent Application No. 11 2013002751.8 dated Jan. 18, 2019, with translation (21 pages).

*Primary Examiner* — Mohammed Shamsuzzaman
*Assistant Examiner* — Aaron J Gray
(74) *Attorney, Agent, or Firm* — Osha Liang LLP

(57) ABSTRACT

A method for fabricating a high-voltage insulated gate type bipolar semiconductor device by comparing to a reference structure of the same includes determining a width S of a mesa region in which the gate insulating film and the MOS transistor are formed, and a trench depth $D_T$, based on a scaling ratio K, in comparison with a second width and a second trench depth of the reference structure, and setting a cell width 2W of the high-voltage insulated gate type bipolar semiconductor device to be equal in length to a second length of the reference structure, the scaling ratio K being defined as K=Y/X, where X indicates a size of a target portion to be miniaturized in the high-voltage insulated gate type bipolar semiconductor device, and Y indicates a size of a target portion to be miniaturized in the reference structure.

17 Claims, 11 Drawing Sheets

(51) Int. Cl.
*H01L 21/332* (2006.01)
*H01L 29/739* (2006.01)
*H01L 29/423* (2006.01)
*H01L 21/265* (2006.01)
*H01L 29/49* (2006.01)
*H01L 21/28* (2006.01)

(52) U.S. Cl.
CPC .... *H01L 29/4236* (2013.01); *H01L 29/42364* (2013.01); *H01L 29/4916* (2013.01); *H01L 29/7397* (2013.01)

(58) Field of Classification Search
USPC ......... 257/330, 331, 139, E29.201, E21.384; 438/270, 259, 138
See application file for complete search history.

(56) References Cited

U.S. PATENT DOCUMENTS

| | | | |
|---|---|---|---|
| 6,399,998 | B1 | 6/2002 | Chang |
| 2003/0042537 | A1* | 3/2003 | Nakamura ............ H01L 29/402 257/328 |
| 2003/0080355 | A1 | 5/2003 | Shirai et al. |
| 2004/0164349 | A1* | 8/2004 | Nishiwaki ........... H01L 29/0696 257/330 |
| 2004/0185622 | A1 | 9/2004 | Williams et al. |
| 2005/0199953 | A1* | 9/2005 | Kawamura ....... H01L 29/41741 257/341 |
| 2005/0263852 | A1* | 12/2005 | Ogura ................. H01L 29/0834 257/565 |
| 2012/0049270 | A1* | 3/2012 | Hirler ................ H01L 29/6634 257/328 |

* cited by examiner

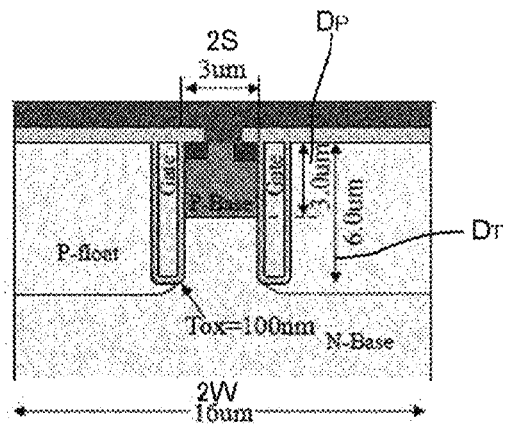
FIG. 3A $k=1$
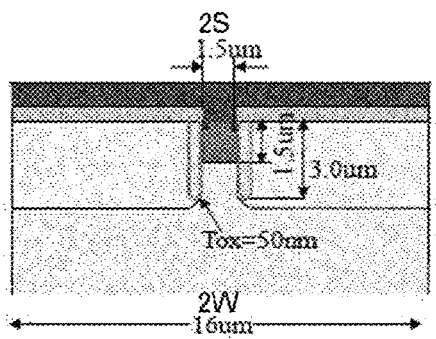 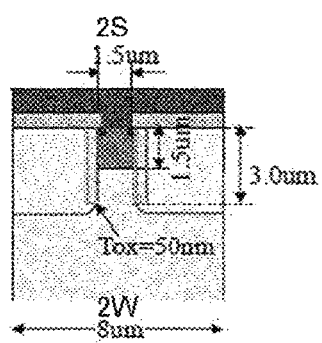
FIG. 3B Miniaturization in the present invention $k=2$    FIG. 3B' Simple miniaturization $k=2$
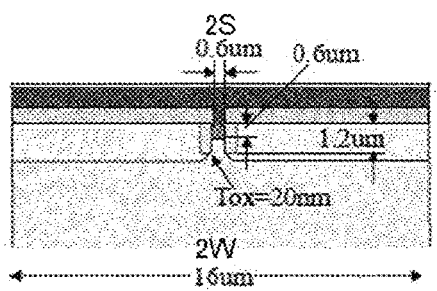 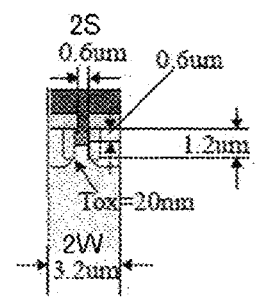
FIG. 3C Miniaturization in the present invention $k=5$    FIG. 3C' Simple miniaturization $k=5$ FIG. 5A Miniaturization of only main part
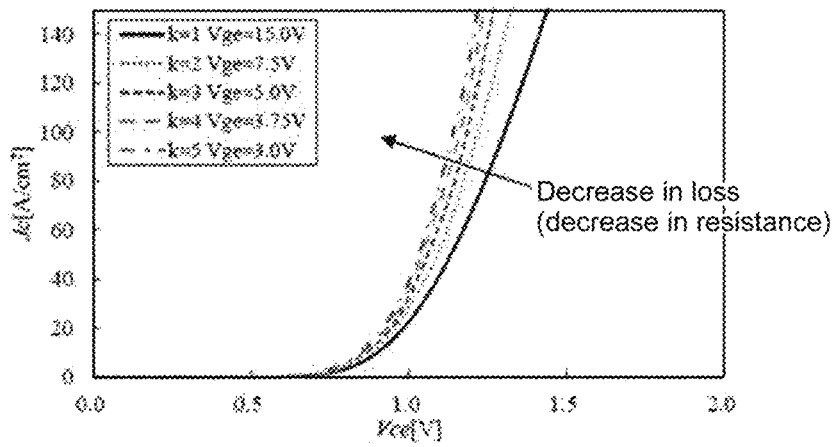
FIG. 5B Simple miniaturization
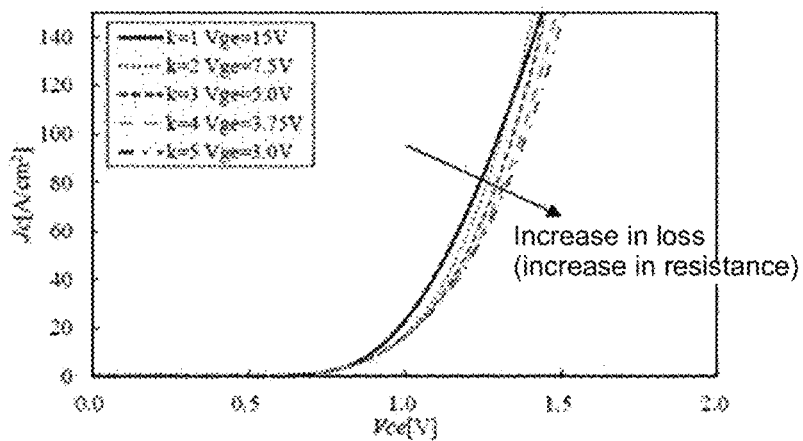

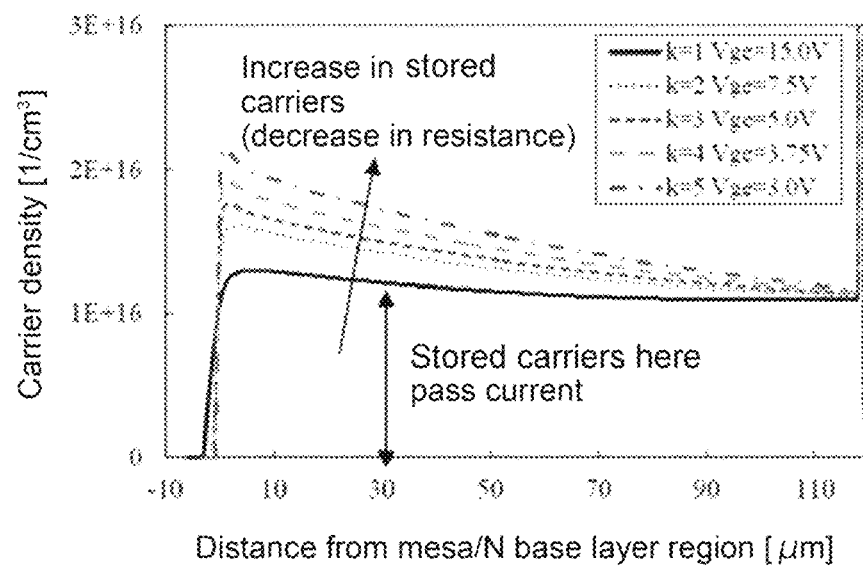
FIG. 6A  Miniaturization of only main part
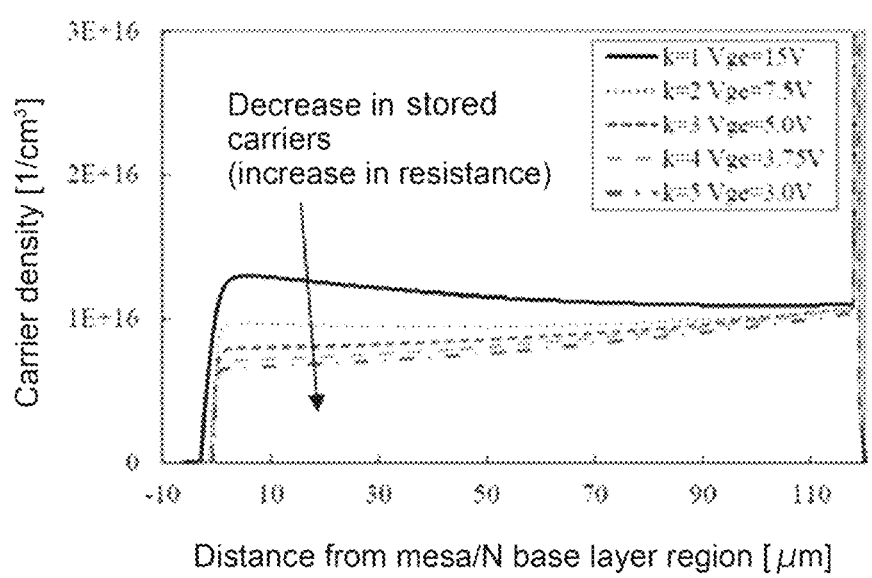
FIG. 6B  Simple miniaturization

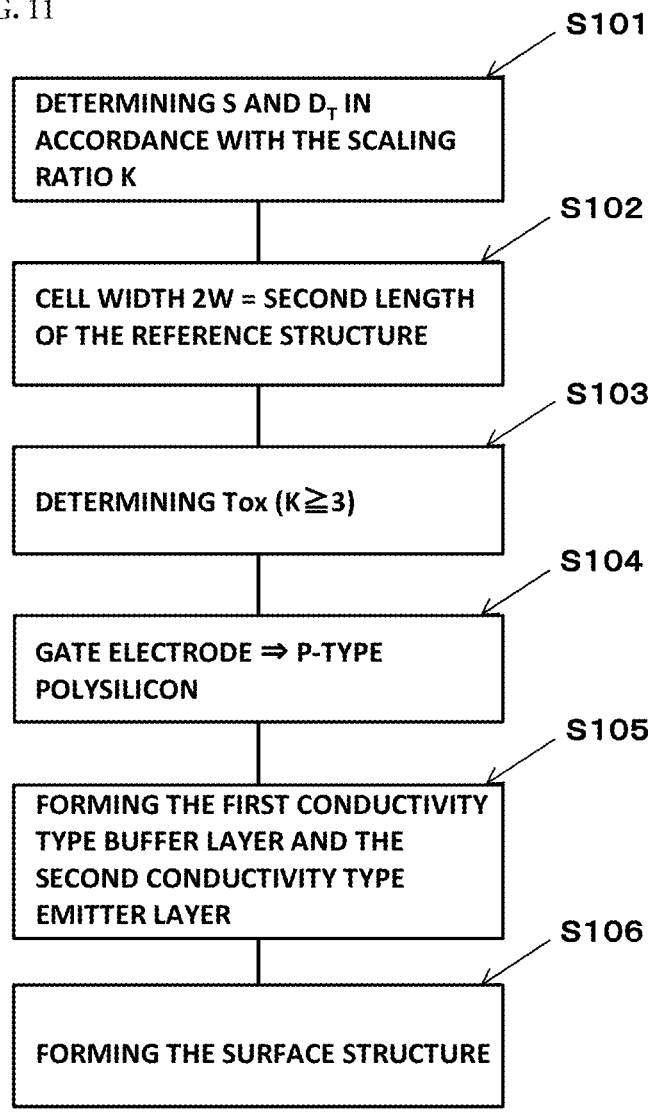

METHOD FOR FABRICATING HIGH-VOLTAGE INSULATED GATE TYPE BIPOLAR SEMICONDUCTOR DEVICE

TECHNICAL FIELD

One or more embodiments of the present invention relate to a power semiconductor device, and more particularly, to a method for fabricating a high-voltage insulated gate type bipolar semiconductor device with a reduced conduction loss.

BACKGROUND

As for the high-voltage insulated gate type semiconductor device, an IGBT (Insulated Gate Bipolar Transistor) has been widely used. FIG. 1 shows a structure diagram of the IGBT.

As shown in FIG. 1, an IGBT structure includes trenches 2 and 3 selectively formed in a front surface of a low-concentration N type layer (N base layer 1) with large intervals and narrow intervals provided alternately, gate insulating films 4 and 5 formed on surfaces of the trenches 2 and 3, respectively, polysilicon gate electrodes (control electrodes) 6 and 7 formed inside the gate insulating films 4 and 5, respectively, a P base layer (P well layer) 8 selectively formed between the adjacent trenches sharing the narrow interval, a high-concentration N source layer 9 selectively formed on a front surface of the P base layer 8, and an emitter electrode 10 connected to each of the P base layer 8 and the N source layer 9. A MOS transistor structure is formed in surface portions of the N source layer 9, the P base layer 8, and the N base layer 1, and a P type layer (a P type layer 11 having an unfixed potential) is formed between the adjacent trenches sharing the large interval to have the same depth as the trench and so as not to be connected to the emitter electrode 10 or so as to be connected to the emitter electrode 10 through a high resistor. Furthermore, the IGBT structure includes an N buffer layer 12 uniformly formed on a back surface of the N base layer 1 so as to have a higher impurity concentration than the N base layer 1, a high-concentration P type layer (P emitter layer 13) uniformly formed on a front surface of the N buffer layer 12, and a collector electrode 14 uniformly formed on a front surface of the P emitter layer 13.

As for the IGBT having the trench structure, various kinds of proposals and studies have been made as disclosed in Patent Document 1 and Non-patent Documents 1 to 9.

PATENT DOCUMENT

Patent Document 1: U.S. Pat. No. 7,709,887

NON-PATENT DOCUMENTS

Non-patent Document 1: M. Kitagawa, et al., "A 4500 V injection enhanced insulated gate bipolar transistor (IEGT) operating in a mode similar to a thyristor", IEDM Technical Digest, pp. 679-682, 1993.
Non-patent Document 2: M. Harada, et al., "600 V Trench IGBT in Comparison with Planar IGBT—An Evaluation of the Limit of IGBT performance—", Proc. of the 6th International Symposium on Power Semiconductor Devices & IC's (ISPSD), pp. 411-416, 1994.
Non-patent Document 3: M. Momose, et al., "A 600 V Super Low Loss IGBT with Advanced Micro-P Structure for the next Generation IPM", Proc. of the 22nd International Symposium on Power Semiconductor Devices & IC's (ISPSD), pp. 379-382, 2010.
Non-patent Document 4: T. Laska, et al., "The Field Stop IGBT (FS IGBT)—A New Power Device Concept with a Great Improvement Potential", Proc. of 12th ISPSD, pp. 355-358, 2000.
Non-patent Document 5: A. Nakagawa, "Theoretical Investigation of Silicon Limit Characteristics of IGBT, Proc. of the 18th International Symposium on Power Semiconductor Devices & IC's (ISPSD), Session 1-2, 2006.
Non-patent Document 6: M. Takei, et al., "DB (Dielectric Barrier) IGBT with Extreme Injection Enhancement", Proc. of the 22nd International Symposium on Power Semiconductor Devices & IC's (ISPSD), pp. 383-386, 2010.
Non-patent Document 7: M. Baus, et al., "Fabrication of Monolithic Bidirectional Switch (MBS) devices with MOS-controlled emitter structures", Proc. of the 18th International Symposium on Power Semiconductor Devices & IC's (ISPSD), Session 6-28, 2006.
Non-patent Document 8: Robert H. Dennard, et al., "Design of Ion-Implanted MOSFET's with Very Small Physical Dimensions", IEEE Journal of Solid-State Circuits, Vol. SC-9, No. 5, pp. 256-268, Oct. 1974.
Non-patent Document 9: M. Tanaka, et al., "Structure Oriented Compact Model for Advanced Trench IGBTs without Fitting Parameters for Extreme Condition: part I", Microelectronics Reliability 51, pp. 1933-1937, 2011.

SUMMARY

According to the above-described conventional IGBT structure, depth of the trench gate structure and the impurity diffusion layer (P type layer 11 having the unfixed potential) are about 5 μm which is larger than that of a normal LSI process. Therefore, there are problems that it takes time in the process of forming the structure, such as an RIE (Reactive Ion Etching) process in forming the trench gate, and a heat diffusion process in forming the diffusion layer. In addition, as described above, when the trench structure is formed deeply in the wafer, the warpage is generated in the wafer, so that it is difficult to increase a diameter of the wafer which is indispensable to improve mass productivity. Furthermore, according to a recent IGBT, its wafer thickness is reduced to about 100 μm to improve the performance, and it is further likely to be reduced. However, it is difficult to further reduce the thickness of the structure having the trench gate and the diffusion layer deeply formed in the wafer.

Here, an example of a process of manufacturing the conventional IGBT will be described with reference to FIG. 10.

(a) As shown in FIGS. 10A-1 and 10A-2, as the front surface structure of the IGBT, the P type layer 11 having the unfixed potential, the P base layer 8, the N source layer 9, the gate insulating films 4 and 5, and the emitter electrode 10 are formed in a semiconductor substrate 20 serving as the N base layer 1 having a thickness of 400 μm to 600 μm. The P type layer 11 is made of boron, and the N source layer 9 is made of phosphor and arsenic. The gate insulating films 4 and 5 are made of thermally-oxidized film, CVD oxide film, polyimide, or the like. The emitter electrode 10 is made of AlSi or Ti—Al.

(b) As shown in FIGS. 10B-1 and 10B-2, the semiconductor substrate 20 is turned upside down, a protection tape 30 is attached on a back surface, and the semiconductor substrate 20 is thinned to 100 μm to 150 μm by grinding with a grinder and wet etching.

(c) As shown in FIGS. 10C-1 and 10C-2, as the back surface structure of the IGBT, the N buffer layer 12 and the P emitter layer 13 are formed by impurity ion implantation processes and then short-time (several 10 sec. to several sec.) annealing processes. The N buffer layer 12 is made of phosphor, and the P emitter layer 13 is made of boron. Since only the back surface is heated at high temperature (about 1000° C.) by annealing, the IGBT structure on the front surface is not affected. Then, the collector electrode 14 (made of Ai-Ni—Au, for example) is attached.

(d) As shown in FIGS. 10D-1 and 10D-2, the protection tape 30 is removed. Then, sintering is performed at about 400° C.

Thus, the above is the conventional process of manufacturing the high-performance IGBT having the deep diffusion layer, but this has the following problems.

Problems when the back surface and the front surface are formed in this order (i) A degree of freedom of the back surface process is reduced, so that the performance of the IGBT cannot be improved, that is, the loss cannot be reduced. In addition, when the lifetime is controlled with respect to the highly-implanted carriers, the number of the processes is increased, and in addition, a high-temperature operation becomes difficult to perform.

Problems when the front surface and the back surface are formed in this order (ii) The number of processes is increased, and in addition, a yield is lowered due to a scratch, crack, contamination because the fine front surface structure is to be in contact with a stage, loader, or protection tape.

(iii) The semiconductor substrate 20 could be damaged in the grinding with a grinder during the process.

(iv) Flatness of the back surface is damaged, so that in-plane characteristics vary. In addition, the back surface process cannot be deeply formed, so that a waveform is largely oscillated.

(v) The back surface is difficult to pattern because of unevenness caused when the protection tape is attached.

Thus, one or more embodiments of the present invention provide a high-voltage insulated gate type bipolar semiconductor device (IGBT) which needs only a short time to form a trench gate in a wafer, can make a suitable response to a thinned and large-diameter wafer, and improve mass productivity, and a method for manufacturing the same.

One or more embodiments of the present invention provide a method for fabricating a high-voltage insulated gate type bipolar semiconductor device by comparing to a reference structure of the same, the high-voltage insulated gate type bipolar semiconductor device including a low-concentration base layer having a first conductivity type, a plurality of trenches formed on a front surface of the low-concentration first conductivity type base layer, the trenches being arranged such that adjacent trenches are spaced away from each other alternately by a large interval and a small interval, a gate insulating film formed on a surface of each of the trenches, a gate electrode formed inside of the gate insulating film, a base layer having a second conductivity type, the base layer being formed between the adjacent trenches spaced away from each other by the small interval, a high-concentration source layer having a first conductivity type, the high-concentration source layer being formed on a front surface of the second conductivity type base layer, a first main electrode electrically connecting to both the second conductivity type base layer and the first conductivity type source layer, a MOS transistor formed on front surfaces of the first conductivity type source layer, the second conductivity type base layer, and the low-concentration first conductivity type base layer, a buffer layer having a first conductivity type, the buffer layer being formed on a back surface of the low-concentration first conductivity type base layer, and having an impurity concentration higher than the same of the low-concentration first conductivity type base layer, a high-concentration emitter layer having a second conductivity type, the high-concentration emitter layer being formed on a front surface of the first conductivity type buffer layer, and a second main electrode formed on a front surface of the second conductivity type emitter layer, the method including determining a width S of a mesa region in which the gate insulating film and the MOS transistor are formed, and a trench depth $D_T$, $$S = R1/K$$

$$D_T = R2/K$$

R1: a second width of the reference structure
R2: a second trench depth of the reference structure
K: a scaling ratio defined as K=Y/X, wherein X indicates a size of a target portion to be miniaturized in the high-voltage insulated gate type bipolar semiconductor device, and Y indicates a size of a target portion to be miniaturized in the reference structure, and setting a cell width 2W of the high-voltage insulated gate type bipolar semiconductor device to be equal in length to a second length of the reference structure.

One or more embodiments of the present invention include setting the scaling ratio K to be equal to or greater than three.

One or more embodiments of the present invention include setting the cell width 2W to have a length in the range of 15 micrometers to 20 micrometers both inclusive.

One or more embodiments of the present invention include setting the second trench depth to have a depth in the range of 5 micrometers to 6 micrometers both inclusive.

One or more embodiments of the present invention include determining a film thickness Tox of the gate insulating film such that the scaling ratio K is equal to greater than three, and Tox=(a film thickness of a second gate insulating film of the reference structure)/K, determining a voltage Vge with which a gate in the MOS transistor is driven, $$Vge = V_A/K$$

wherein $V_A$ indicates a voltage with which a second gate in the reference structure is driven, and K indicates the scaling ratio used for determining the film thickness Tox.

One or more embodiments of the present invention include setting a thickness of the second conductivity type emitter layer formed on a back surface of the low-concentration first type conductivity base layer, to be equal to or greater than 10 nanometers, but equal to or smaller than 1 micrometer.

One or more embodiments of the present invention include forming a gate electrode in each of the trenches to be P type polysilicon.

One or more embodiments of the present invention include forming the first conductivity type buffer layer and the second conductivity type emitter layer on a back surface of the low-concentration first conductivity type base layer, and subsequently to the previous step of forming the first conductivity type buffer layer and the second conductivity type emitter layer, forming a surface structure including the trenches and the MOS structure, on a back surface of the low-concentration first conductivity type base layer.

One or more embodiments of the present invention include setting an interval between centers of the trenches located adjacent to each other in the reference structure, to be in the range of 3 micrometers to 4 micrometers both inclusive, and setting the scaling ratio K to be equal to or greater than three in the case that the interval is in the range of 3 micrometers to 4 micrometers both inclusive.

One or more embodiments of the present invention include forming both the first conductivity type buffer layer and the second conductivity type emitter layer on a back surface of the low-concentration first conductivity type base layer, and subsequently to the previous step of forming both the first conductivity type buffer layer and the second conductivity type emitter layer, forming a front surface structure including both the trenches and the MOS transistor on a front surface of the low-concentration first conductivity type base layer.

One or more embodiments of the present invention provide a method for fabricating a high-voltage insulated gate type bipolar semiconductor device by comparing to a reference structure of the same, the high-voltage insulated gate type bipolar semiconductor device including a low-concentration base layer having a first conductivity type, a plurality of trenches formed on a front surface of the low-concentration first conductivity type base layer, the trenches being arranged such that adjacent trenches are spaced away from each other alternately by a large interval and a small interval, a gate insulating film formed on a surface of each of the trenches, a gate electrode formed inside of the gate insulating film, a base layer having a second conductivity type, the base layer being formed between the adjacent trenches spaced away from each other by the small interval, a high-concentration source layer having a first conductivity type, the high-concentration source layer being formed on a front surface of the second conductivity type base layer, an emitter electrode electrically connecting to both the second conductivity type base layer and the first conductivity type source layer, a MOS transistor formed on front surfaces of the first conductivity type source layer, the second conductivity type base layer, and the low-concentration first conductivity type base layer, a layer having a second conductivity type and having a non-fixed potential, the layer being formed between the adjacent trenches spaced away from each other by the large interval such that the layer is not electrically connected with the emitter electrode or is electrically connected with the emitter electrode through a high resistance, the layer having a depth almost equal to a depth of the trenches, a buffer layer having a first conductivity type, the buffer layer being formed on a back surface of the low-concentration first conductivity type base layer, and having an impurity concentration higher than the same of the low-concentration first conductivity type base layer, a high-concentration emitter layer having a second conductivity type, the high-concentration emitter layer being formed on a front surface of the first conductivity type buffer layer, and a collector electrode formed on a front surface of the second conductivity type emitter layer, the method including setting a width S of a mesa region in which the gate insulating film and the MOS transistor are formed, a trench depth $D_T$, and a film thickness Tox of the gate insulating film to be smaller than C1/K, C2/K and C3/K, respectively, wherein C1 indicates a second width in the reference structure, C2 indicates a second trench depth in the reference structure, C3 indicates a film thickness of a second gate insulating film in the reference structure, and K indicates a scaling ratio K being defined as K=Y/X, wherein X indicates a size of a target portion to be miniaturized in the high-voltage insulated gate type bipolar semiconductor device, and Y indicates a size of a target portion to be miniaturized in the reference structure, setting a cell width 2W of the high-voltage insulated gate type bipolar semiconductor device to be equal in length to a cell width of the reference structure.

One or more embodiments of the present invention provide a method for fabricating a high-voltage insulated gate type bipolar semiconductor device by comparing to a reference structure of the same, including:

determining a reference structure of the high-voltage insulated gate type bipolar semiconductor device;

determining a scaling ratio K defined as K=Y/X, wherein

X indicates a size of a target portion to be miniaturized in the high-voltage insulated gate type bipolar semiconductor device, and Y indicates a size of a target portion to be miniaturized in the reference structure; and determining a size of the target portion of the high-voltage insulated gate type bipolar semiconductor device in accordance with the scaling ratio K.

ADVANTAGES

According to one or more embodiments of the present invention, it is possible to provide a method for fabricating the high-voltage insulated gate type bipolar semiconductor device which needs only a short time to form the trench gate in the wafer, can make a suitable response to the thinned and large-diameter wafer, and improve mass productivity.

Furthermore, the method in accordance with one or more embodiments of the present invention ensures that the high-performance (low-loss) IGBT can be manufactured with the less steps and high yield.

BRIEF DESCRIPTION OF THE DRAWINGS

FIGS. 3A, 3B, 3B', 3C, and 3C' illustrate a structure diagram showing a comparison between miniaturization of only a major part according to an embodiment of the present invention and simple miniaturization according to a conventional method, in which FIG. 3A shows a basic form, FIG. 3B and FIG. 3C are the case of the major part miniaturization according to an embodiment the present invention, and FIG. 3B' and FIG. 3C' are the case of the simple miniaturization according to the conventional method.

FIGS. 5A and 5B illustrate graphs each showing a change in collector current with respect to a collector-emitter voltage when a current flows, in which FIG. 5A is the case of the major part miniaturization according to an embodiment the present invention, and FIG. 5B is the case of the simple miniaturization according to the conventional method.

FIGS. 6A and 6B illustrate graphs each showing a stored carrier (hole) distribution in an N base layer, in which FIG. 6A is the case of the major part miniaturization according to an embodiment the present invention, and FIG. 6B is the case of the simple miniaturization according to the conventional method.

FIGS. 7A-1, 7B-1, 7A-2, and 7B-2 illustrate manufacturing process diagrams each showing a manufacturing method according to a first embodiment of the present invention, in which FIG. 7A-1 and FIG. 7B-1 are front perspective views, and FIG. 7A-2 and FIG. 7B-2 are enlarged cross-sectional views.

FIGS. 8A-1, 8B-1, 8C-1, 8D-1, 8A-2, 8B-2, 8C-2, and 8D-2 illustrate manufacturing process diagrams each showing a manufacturing method according to a second embodiment of the present invention, in which FIG. 8A-1 to FIG. 8D-1 are front perspective views, and FIG. 8A-2 to FIG. 8D-2 are enlarged cross-sectional views.

FIGS. 10A-1, 10B-1, 10C-1, 10D-1, 10A-2, 10B-2, 10C-2, and 10D-2 are manufacturing process diagrams each showing a conventional method for manufacturing an IGBT, in which FIG. 10A-1 to FIG. 10D-1 are front perspective views, and FIG. 10A-2 to FIG. 10D-2 are enlarged cross-sectional views.

FIG. 11 illustrates a flow chart showing steps to be carried out in the method for fabricating IBGT, in accordance with an embodiment of the present invention.

DETAILED DESCRIPTION

Hereinafter, embodiments of the present invention will be specifically described. Here, it is to be noted that the description will be given assuming that a first conductivity type is an N type and a second conductivity type is a P type in this embodiment, but they may be exchanged such that the first conductivity type is the P type and the second conductivity type is the N type.

Figure 2:
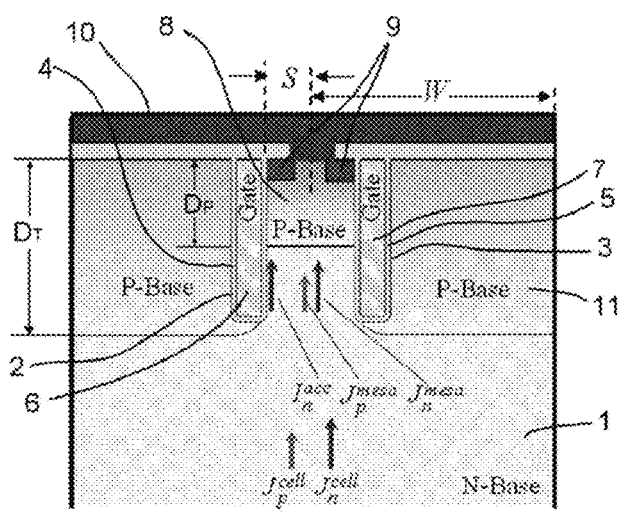
FIG. 2 illustrates a structure diagram showing current flows in the trench gate type IGBT.

As shown in FIG. 2, implantation efficiency on a cathode side is modeled with structural parameters of a trench gate type IGBT. According to this model, an electron current from a gate of a MOS (Metal Oxide Semiconductor) is divided into two paths in the mesa region between the P base layer 8 and the N base layer 1. That is, those are currents having current densities shown by Jnmesa and Jpmesa.

Jnmesa and Jpmesa are modeled as follows. Here, it is assumed that electrons and holes are diffused in one dimensional manner. Due to the occurrence of conductive modulation by conductivity modulation, the densities of the electrons and the holes are maintained almost the same. As a result, the following differential equation can be obtained as an ambipolar diffusion formula.

[Formula 1]

$$\mu_p \cdot J_n^{mesa} - \mu_n \cdot J_p^{mesa} = 2 \cdot \mu_p \cdot \mu_n \cdot kT \frac{dn}{dx} \quad (1)$$

Here, µp and µn represent a hole mobility and an electron mobility, respectively, k represents the Boltzmann constant, T represents an absolute temperature, and dn/dx represents a density gradient of the electrons and holes.

Furthermore, an electron current formula in an electron stored layer (formed in an insulating film surface of a trench gate sidewall which is in contact with the N base layer 1) is expressed by the following formula.

[Formula 2]

$$I_n^{acc} = -\mu_{acc} \cdot Q_{acc} \frac{d\phi_n}{dx} \quad (2)$$

Here, µacc represents an electron mobility in the electron stored layer formed on a trench gate side surface when a gate voltage is applied, Qacc represents a charge density of the electron stored layer per unit area, and dφn/dx represents a gradient of an electron potential (electron quasi-Fermi potential) along the electron stored layer.

Equations of a cell current and a mesa current are obtained based on a cell width and a mesa width shown in FIG. 2.

[Formula 3]

$$W \cdot J_p^{cell} = S \cdot J_p^{mesa} \quad (3)$$

[Formula 4]

$$W \cdot J_n^{cell} = I_n^{acc} + S \cdot J_n^{mesa} \quad (4)$$

Here, W represents a half pitch of the cell width, and S represents a half width of the P base layer (mesa width).

A formula (5) is obtained according to the formulas (1) to (4).

[Formula 5]

$$\left(\frac{\mu_p}{\mu_n}\left(\frac{\mu_{acc} \cdot Q_{acc}}{q \cdot \mu_n \cdot n(x) \cdot S} + 1\right)^{-1} + 1\right)\gamma_n - 1 = \frac{2q \cdot D_p}{J} \frac{S}{W} \frac{dn}{dx} \quad (5)$$

Here, q represents an elementary charge, γn represents an electron implantation efficiency, and Dp represents a depth of the P type layer 11.

The formula (5) is a basic formula of a scaling law.

The scaling law in one or more embodiments of the present invention is collectively shown in Table 1. This scaling law can be logically derived from the formula (5). The formula (5) shows that a scaled device has the same implantation efficiency under the following conditions.

[Formula 6]

$$\frac{\mu_{acc} \cdot Q_{acc}}{q \cdot \mu_n \cdot n(x) \cdot S} = const. \quad (6)$$

[Formula 7]

$$\frac{S}{W} \frac{dn}{dx} = const. \quad (7)$$

Even when an electric field intensity of the gate oxide film is scaled down so as to satisfy Eox'=Eox/k and an electric field intensity in the gate oxide film is reduced, the formula (6) is constant with respect to a certain constant value of n (x), and as a result, the formula (7) can be derived from the formula (5) as long as the density of the current flowing in the IGBT is the same. More specifically, as described above, even under the condition that the electric field intensity of the gate oxide film is scaled down so as to satisfy Eox'=Eox/k and the electric field intensity in the gate oxide film is reduced, as long as the half pitch W of the cell width is constant, dn/dx in the mesa portion is increased inversely as the half width S of the P base layer is reduced, so that even when a depth (DT-DP) of the trench which projects from the P base layer 8 is reduced in proportion to the half width S, the carrier density under the trench is not changed. In addition, under this condition, the gate voltage is reduced inversely with the square of k, that is, $Vg'=Vg/k^2$.

The above conclusion shows that the density of the carriers (the electrons and the holes) to pass the current is not changed under the condition that the major part of the IGBT (the MOS channel region sandwiched between the two trenches) is reduced, the gate voltage is reduced inversely with the square of the k, and the electric field of the gate insulating film is reduced inversely with k. In general, as for the gate insulating film, even when it is thinned, its breakdown electric field does not change or it is increased, so that the condition could be $Eox'=Eox$ and based on this condition, the left-hand side of the formula (6) is not constant, but increased as the size is reduced.

When this result is applied to the formula (5), the members acting on γn (members in parentheses) is reduced, and under the condition that γn is the same, an absolute value of the left-hand side of the formula is increased. As a result, the left-hand side of the formula (7) in the mesa portion, that is, S/W*dn/dx is not constant as described above, but it is increased. This means that compared with the above-described case, the dn/dx in the mesa portion is larger and the carrier density can be more increased. In this case, since $Eox'=Eox$ is satisfied, the scaling of the voltage Vg applied between the gate and emitter is such that $Vg'=Vg/k$. That is, without applying a high electric field to the gate oxide film, a high carrier amount can be achieved due to the miniaturization, and a conduction loss of the IGBT can be reduced. That is, the lower Vce (sat) can be achieved.

TABLE 1

| | Scaling ratio | |
|---|---|---|
| Parameters | Electric field intensity in gate oxide film $Eox'$ = Eox/k | Electric field intensity in gate oxide film Eox = Constant |
| Gate voltage Vg | $1/k^2$ | 1/k |
| P base layer half width S | 1/k | |
| Cell half pitch W | 1 | |
| N emitter width WE | 1/k | |
| Trench depth DT | 1/k | |
| P base layer depth DP | 1/k | |
| N emitter depth DE | 1/k | |
| Contact hole half width WC | 1/k | |
| Gate insulating film thickness Tox | 1/k | |
| Gate-emitter capacity Cge | 1 | |
| Gate-collector capacity Cgc | 1 | |
| Collector-emitter capacity Cce | 1/k | |
| Contact hole current density Jch | k | |
| Gate charge Qg | $1/k^2$ | 1/k |
| Electron implantation efficiency γn | 1 | >1 |
| Stored carrier density n = p | 1 | >1 |

The above-described scaling law was proved and performance improvement was verified by two-dimensional TCAD simulation. They were made on the assumption that the IGBT structure is a thin wafer type punch-through structure at a level of 1.2 kV.

FIG. 3 show a comparison between the miniaturization of only the main portion according to one or more embodiments of the present invention, and simple miniaturization according to the conventional method. In FIG. 3A to FIG. 3C, FIG. 3A shows a basic form (a reference structure having a scaling ratio K equal to one), FIG. 3B and FIG. 3C show the case of the miniaturization of the main portion according to one or more embodiments of the present invention, and FIG. 3B' and FIG. 3C' show the case of the simple miniaturization according to the conventional method. The scaling ratio k is 2 in FIG. 3B and FIG. 3B', and the scaling ratio k is 5 in FIG. 3C and FIG. 3C', but Table 2 shows data of the scaled devices in the cases where k=2, 3, and 4 in addition to the above.

TABLE 2

| Scaling ratio k | k = 1 | k = 2 | k = 3 | k = 4 | k = 5 |
|---|---|---|---|---|---|
| Cell width (an embodiment of the present invention): 2W [μm] | 16.0 | 16.0 | 16.0 | 16.0 | 16.0 |
| Cell width (simple miniaturization): 2W [μm] | (16.0) | (8.0) | (5.3) | (4.0) | (3.2) |
| Mesa width: 2S [μm] (1/k) | 3.0 | 1.5 | 1.0 | 0.8 | 0.6 |
| Trench depth: DT [μm] (1/k) | 6.0 | 3.0 | 2.0 | 1.5 | 1.2 |
| Gate insulating film thickness: Tox [nm] (1/k) | 100 | 50 | 33.3 | 25 | 20 |
| Gate voltage: Vge [V] (1/k) | 15.0 | 7.5 | 5.0 | 3.75 | 3.0 |

Figure 4:
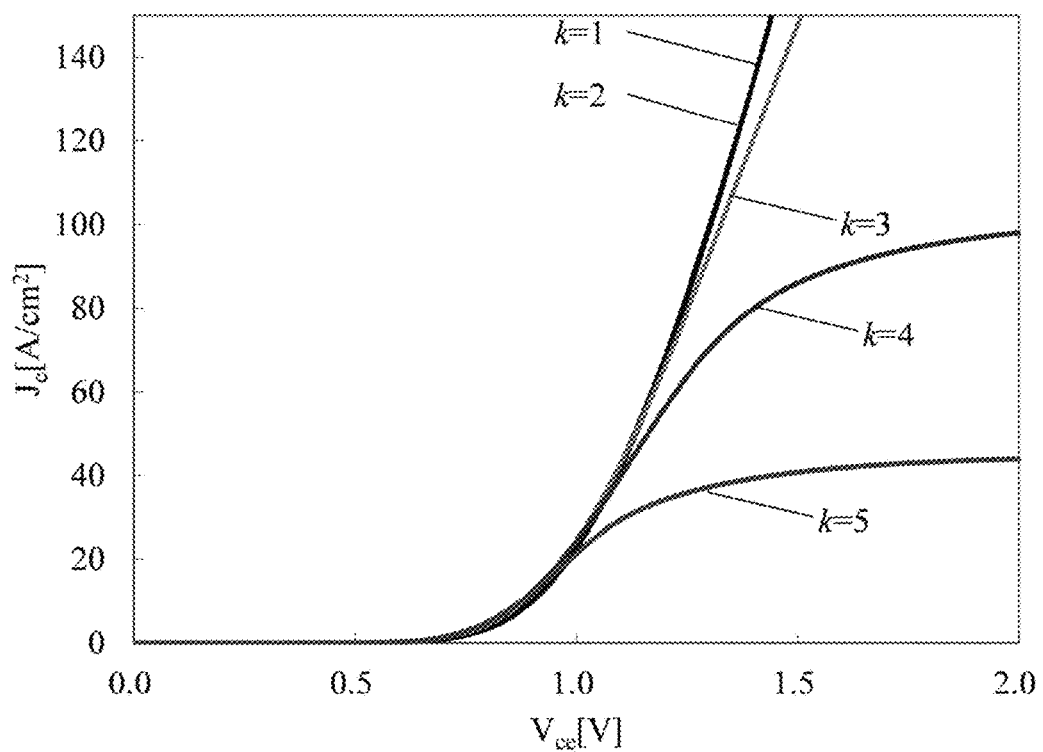
FIG. 4 illustrates a graph showing Jc-Vce characteristics obtained by changing the scale ratio k of the miniaturization.

FIG. 4 shows Jc-Vce characteristics when the gate electric field is such that $Eox'=Eox/k$ in the scaled devices in k=1 to 5.

In the cases where k=1 and k=2, they coincide with each other, but in the case where k=3 to 5, their saturation currents become small. This is because the gate threshold voltage Vth shown in the following formula is moved due to the scaling.

[Formula 8]

$$V_{th} = \frac{\sqrt{2\varepsilon_0\varepsilon_{Si}qN_A\phi_S}}{C_{ox}} + \phi_S \qquad (8)$$

Here, ε0 represents permittivity of vacuum, εSi represents relative permittivity of silicon, Cox represents capacity of the gate in the MOS structure per unit area, NA represents a concentration of an acceptor (P type impurity such as boron) in the P base layer (corresponding to a P well in the MOS structure, in general), and φs represents a surface potential.

The gate capacity per unit area is increased such that $Cox'=kCox$ due to the scale-down, so that the Vth is reduced. However, Vth is not correctly scaled even when NA and φs are constant.

FIG. 5A and FIG. 5B show a comparison of Jc-Vce characteristics in a case where the gate oxide film electric field is constant between (as shown in FIG. 5A) the miniaturization of only the main portion according to an embodiment of the present invention and (as shown in FIG. 5B) the simple miniaturization according to the conventional method. As shown in FIG. 5A, Vce (sat) is reduced due to the scale-down. Meanwhile, as shown in the case of FIG. 5B, Vce (sat) is increased due to the scale-down, and the loss is increased.

FIG. 6A and FIG. 6B show a comparison of a carrier distribution in the N-Base in the on state between (as shown in FIG. 6A) the miniaturization of only the main portion according to an embodiment of the present invention and (as shown in FIG. 6B) the simple miniaturization according to the conventional method. As shown in FIG. 6A, the carrier density on the cathode side is increased due to the scale-down. That is, the high γn and the low Vce (sat) can be obtained in the shallow trench by the scale-down. Meanwhile, as shown in the case of FIG. 6B, the stored carrier density is reduced in the shallow trench by the scale-down.

As described above, according to an embodiment of the present invention, it has been proved that the carrier storage can be increased in the structure of the shallow trench gate and the shallow doping, by the scaling law of the trench gate IGBT.

When the trench IGBT is scaled down by reducing the trench depth, the heat history, the doping depth, and the oxide film thickness, device performance can be improved and the wafer having the large diameter (large-diameter wafer) can be used. A collector voltage drop can be very small with a scaling factor by which the gate oxide film electric field intensity is not increased. Therefore, the scaling law according to an embodiment of the present invention increases a possibility that the mass production can be implemented with the CMOS process. Especially, when the scaling ratio is 5 or less, and the trench depth is reduced to about 1 µm and the thickness of the gate insulating film is reduced to about 20 nm, a thermal process is hardly needed in the manufacturing process, which does not cause a defect in wafer and a reduction in carrier lifetime, so that the IGBT can be further low in conduction loss. In addition, since the warpage of wafer is not generated, the IGBT can be manufactured with the large-diameter wafer, so that the productivity can be considerably improved.

Next, a description will be given to a method for manufacturing the IGBT in the first embodiment of the present invention, with reference to FIGS. 7A-1, 7A-2, 7B-1, and 7B-2.

Figure 1:
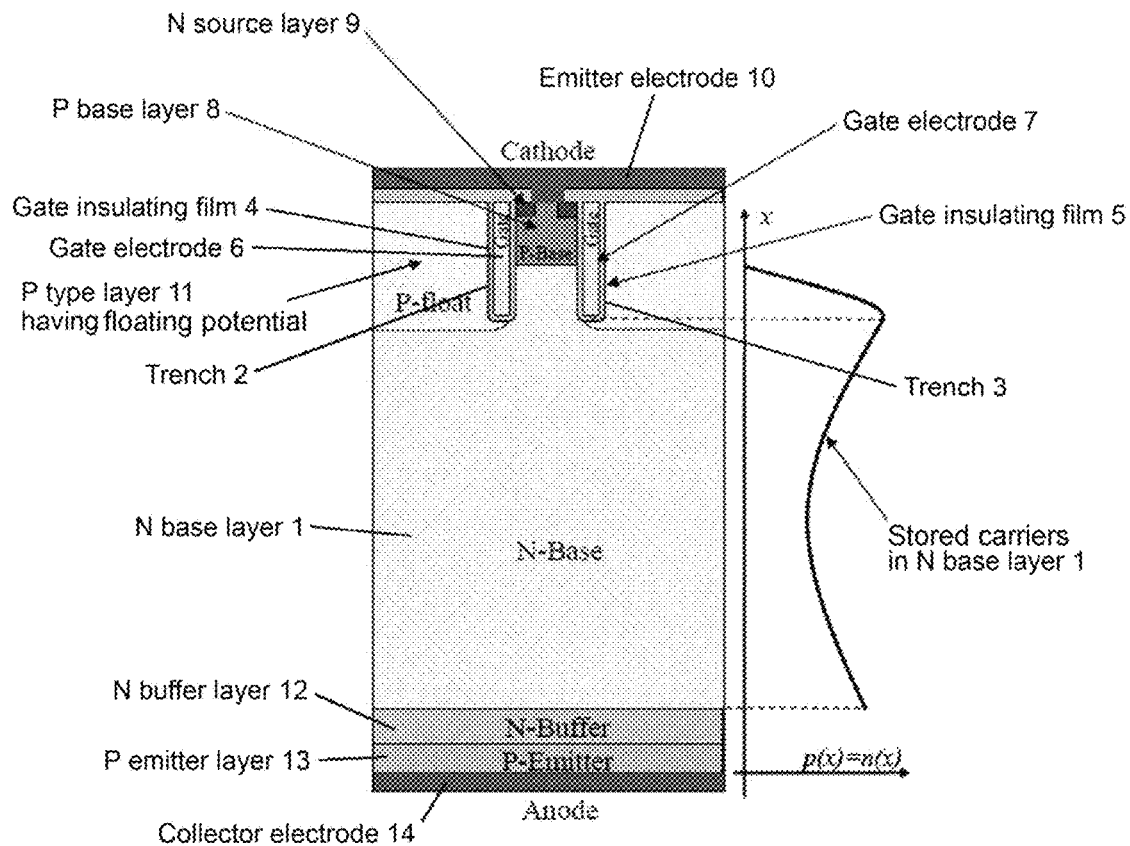
FIG. 1 illustrates a structure diagram of a trench gate type IGBT.
Figures 1, 7A:
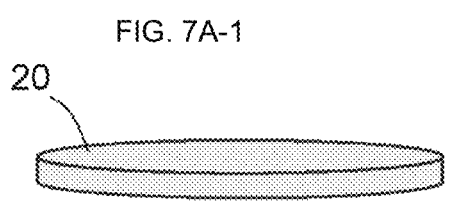
Figures 2, 7A:
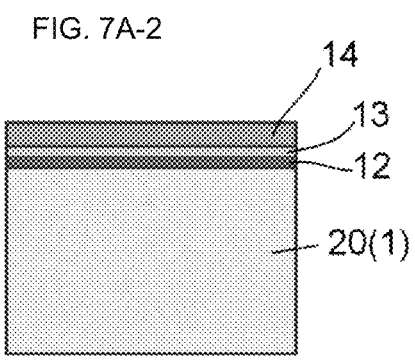

(a) As shown in FIGS. 7A-1 and 7A-2, as a back surface structure of a semiconductor substrate 20 having a thickness of 100 µm to 150 µm, the N buffer layer 12 and the P emitter layer 13 are formed by a short-time (several 10 msec. to several sec.) annealing. Then, the collector electrode 14 as a back surface electrode is attached thereon. Here, a thickness of the P emitter layer 13 is 1 µm or less which can be formed by the short-time annealing.

This IGBT back surface structure has been already practically used as the thin wafer IGBT and a field stop IGBT (FS-IGBT).

The method in one or more embodiments of the present invention has the following benefits compared with the conventional method.

Conventionally, deterioration in switching characteristics due to many carriers in the N base has been improved by a method in which the wafer is irradiated with high-energy electrons, protons or helium or the like to reduce the carrier lifetime in the wafer, so as to accelerate recombination between the electrons and the holes in the N base, and reduce the internal carriers. However, the above irradiation process is high in cost, and in addition, a semiconductor crystal defect is unnecessarily generated, which causes deterioration in characteristics and a decrease in reliability. Especially, the irradiation with protons or the irradiation with helium has a great effect on a local reduction in the carrier lifetime, but the problems are that a leak current is increased at high temperature, reliability deteriorates, and process cost is increased due to the irradiation and annealing. The above back surface structure has a benefit that the device can be manufactured with a high-quality crystal because there is no need to reduce the carrier lifetime. Meanwhile, the formation of the back surface structure has the problem in the manufacturing process. That is, there is an effect of preventing holes from being implanted from the P emitter by forming the extremely thin diffusion layer on the back surface, but there is a need to perform a very low thermal process (at low temperature for a short time) to form the diffusion layer, so that this process needs to be performed after a formation of a front surface structure (a diffusion layer of 5 µm to 6 µm) in a high thermal process (at high temperature for a long time). Therefore, this means that the wafer is inserted in a manufacturing device with its upper surface which has been formed once, facing downward, so that various low yield problems are caused by a surface damage or the like.

Figures 1, 7B:
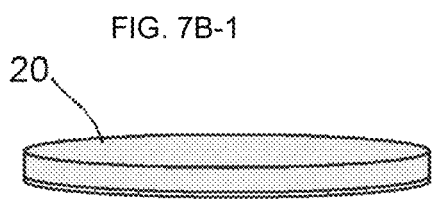
Figures 2, 7B:
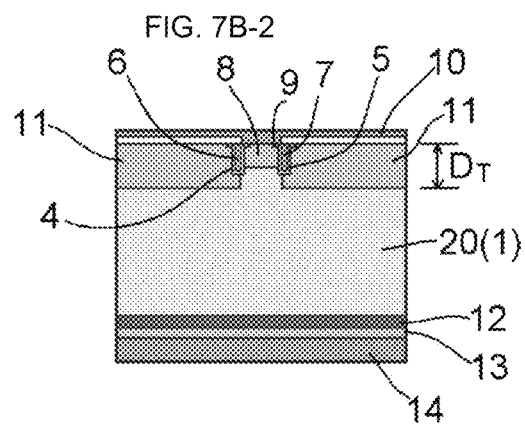

(b) As shown in FIGS. 7B-1 and 7B-2, as the diffusion layers in the front surface structure, the gate insulating films 4 and 5, the gate electrodes 6 and 7 are formed. As the diffusion layers, the P type layer 11 having the unfixed potential is made of boron, and the N source layer 9 is made of phosphor and arsenic. The gate insulating films 4 and 5 are made of thermally-oxidized film, CVD oxide film, polyimide, or the like. The gate electrodes 6 and 7 are made of AlSi or Ti—Al. The diffusion layer is formed by high-acceleration ion implantation (several 100 keV) and short-time annealing (about 1000° C.). A CVD film may be used as the oxide film to avoid the high temperature and long period of time. To form the emitter electrode 10, sintering at about 400° C. is performed as well. Here, the thickness of the P type layer 11 having the unfixed potential is set to 1.5 µm or less since a depth provided by the ion implantation is about 1 µm in general. A conventional depth has been greater, but this depth can be realized by the high-acceleration ion implantation.

According to this embodiment, the process for the front surface does not affect the back surface structure because the heat history in the front surface process is lower than that in the back surface, or the front surface is also subjected to the short-time annealing so that thermal transmission to the back surface is limited. That is, the front surface structure is about 1 µm or less, and the very low heat history can be provided by the high-acceleration ion implantation or the selective ion implantation to the portion of the shallow trench and then the short-time annealing. As a result, the back surface structure is manufactured first, and then the front surface structure is manufactured, so that the process can be performed with a high manufacturing efficiency.

In this manufacturing process, there is a case where the back surface electrode (collector electrode 14) is formed at the end in order to avoid a metal spike and contamination. Furthermore, there is a case where the front surface is protected by a tape when the back surface structure is formed.

Next, a description will be given to a method for manufacturing an IGBT in the second embodiment of the present invention, with reference to FIG. 8.

Figures 1, 8A:
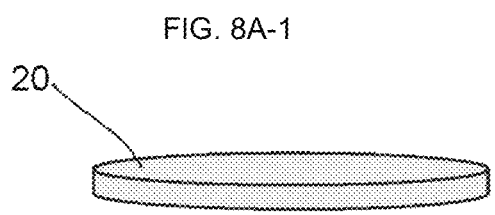
Figures 2, 8A:
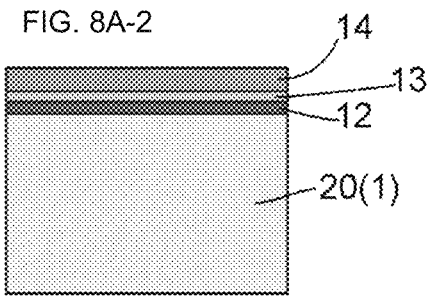

(a) As shown in FIGS. 8A-1 and 8A-2, as a back surface structure of the semiconductor substrate 20 having the thickness of 100 µm to 150 µm, the N buffer layer 12 and the P emitter layer 13 are formed by short-time (several 10 msec. to several sec.) annealing. Then, the collector electrode 14 is formed as the back surface electrode. Here, the thickness of the P emitter layer 13 is 1 µm or less which can be formed by the short-time annealing.

Figures 1, 8B:
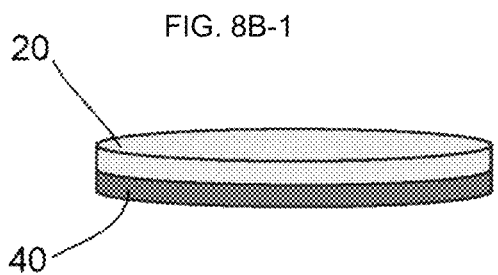
Figures 2, 8B:
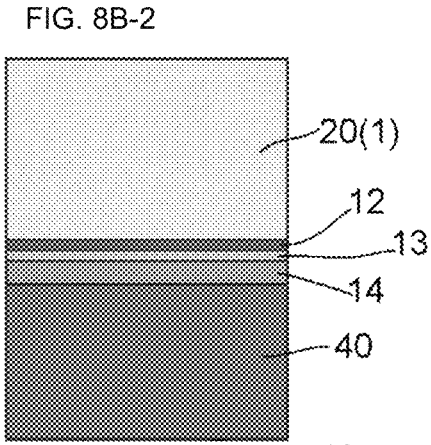

(b) As shown in FIGS. 8B-1 and 8B-2, a stage substrate 40 is attached. The stage substrate 40 may be made of a quartz wafer, silicon wafer, ceramic, polysilicon, or the like. As a bonding material, an oxide film or resin may be used.

Figures 1, 8C:
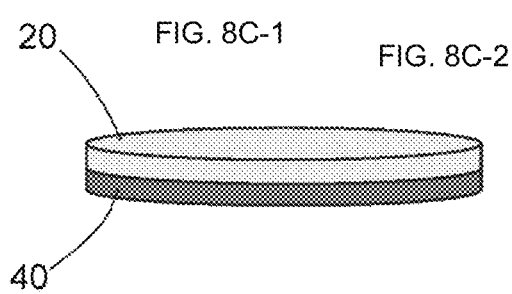
Figures 2, 8C:
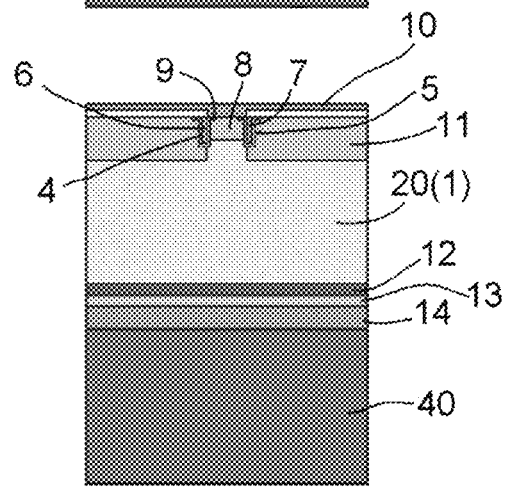

(c) As shown in FIGS. 8C-1 and 8C-2, as the diffusion layers in the front surface structure, the gate insulating films 4 and 5, and the gate electrodes 6 and 7 are made. As the diffusion layers, the P type layer 11 having the unfixed potential is made of boron, and the N source layer 9 is made of phosphor and arsenic. In addition, when the P type layer 11 is formed, a withstand voltage in a blocked state (in an off state) can be improved. The gate insulating films 4 and 5 are made of thermally-oxidized film, CVD oxide film, polyimide, or the like. The gate electrodes 6 and 7 are made of AlSi or Ti—Al. The diffusion layer is formed by high-acceleration ion implantation (several 100 keV) and short-time annealing (about 1000° C.). A CVD film may be used as the oxide film in order to avoid the high temperature and long period of time. To form the emitter electrode 10, sintering at about 400° C. is performed as well.

Figures 1, 8D:
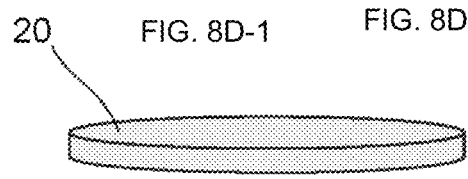
Figures 2, 8D:
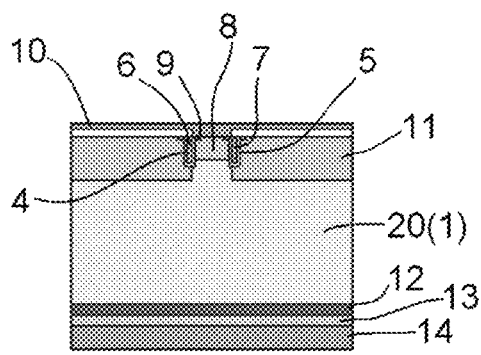

(d) As shown in FIGS. 8D-1 and 8D-2, the stage substrate 40 is removed.

According to the manufacturing method in this second embodiment, the stage substrate 40 is attached during the processes in order to solve the problem that in the case where the wafer (semiconductor substrate 20) is very thin, or the wafer has the large diameter, the wafer is broken or a position cannot be focused in a process such as photolithography because of warpage of the wafer, so that although the number of the steps is increased, the yield is improved compared with the first embodiment.

In addition, in this manufacturing process, there is a case where the back surface electrode (collector electrode 14) is attached at the end in order to avoid the metal spike and contamination.

The manufacturing process of the IGBT in each embodiment described above is only one example, and even when a thick semiconductor substrate is used and a final thickness of the N base layer is 500 μm, and even when the final thickness of the N base layer is thinned to 40 μm to 100 μm by the method described in the first or second embodiment, the performance can be enhanced and the mass production can be achieved.

In each of the first embodiment and the second embodiment, polysilicon is used for the material for the gate electrodes 6 and 7 provided in the trenches 2 and 3, respectively, but when the scaling ratio k is 5 or more especially, P type polysilicon may be used. According to the conventional IGBT, N type polysilicon is used in order to reduce resistance of the electrode material.

Figure 9:
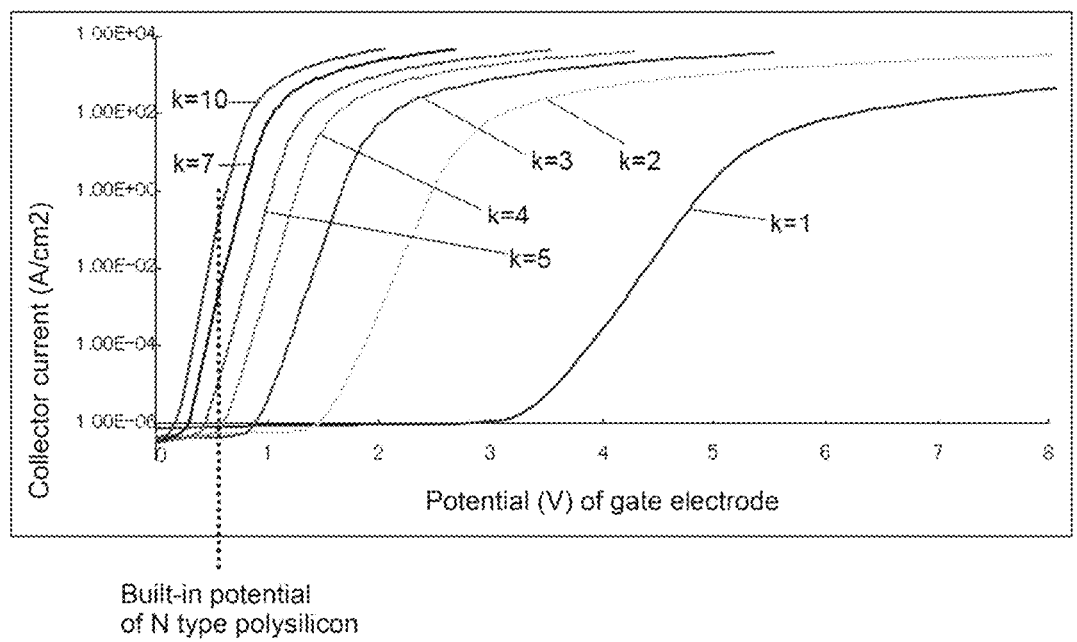
FIG. 9 illustrates a graph showing characteristics of a potential of a gate electrode and collector current with respect to changes of the scaling ratio k when P type polysilicon is used.
Figures 1, 10A:
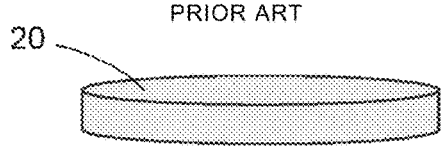
Figures 2, 10A:
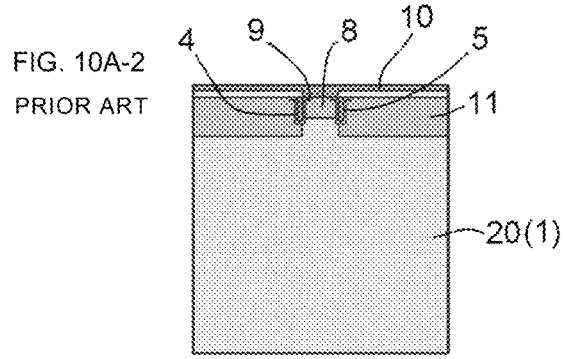
Figures 1, 10B:
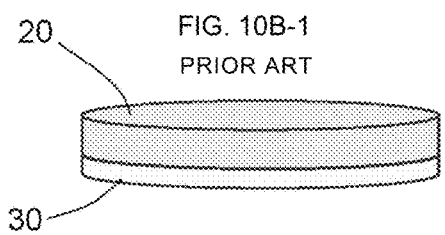
Figures 2, 10B:
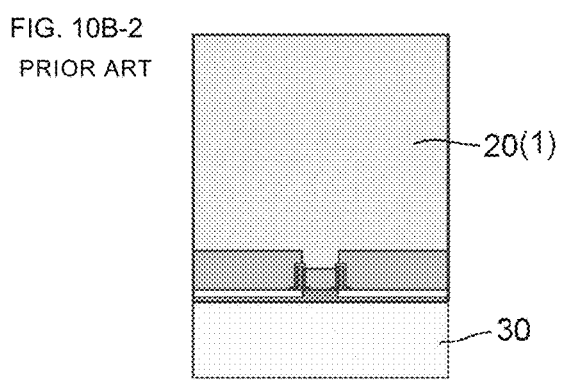
Figures 1, 10C:
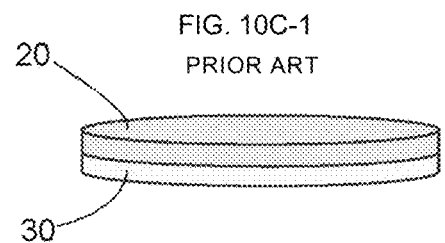
Figures 2, 10C:
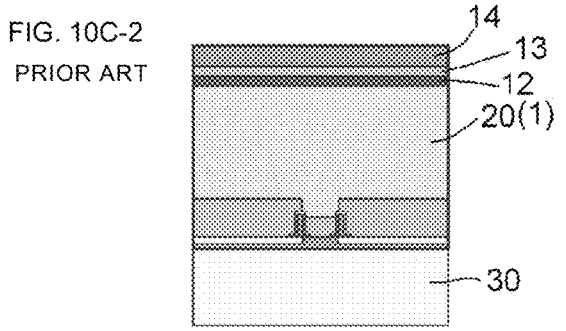
Figures 1, 10D:
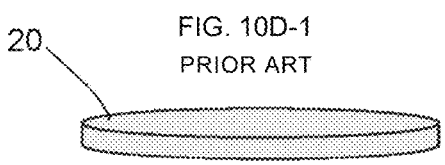
Figures 2, 10D:
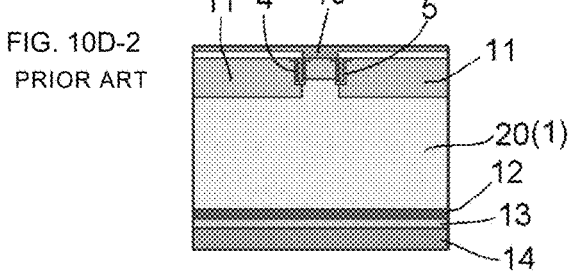

The N type polysilicon is low in resistance compared with the P type polysilicon, so that it is generally used for the gate electrode of the IGBT. As shown in FIG. 9, the N type polysilicon has a positive built-in voltage and the voltage is about 0.5 V to 0.6 V, in general.

However, when the scale ratio k is increased, and the thickness of the gate insulating film is 20 nm or less, a positive voltage corresponding to the built-in voltage is generated in the gate electrode inside the element due to the built-in voltage even when 0 V is applied to the gate terminal, so that this voltage induces some electrons to a P base interface. As shown in FIG. 9, as for the voltage shown by a broken line (built-in voltage of the N type polysilicon), in the case where the scaling ratio k is 5 or more, a collector current (leak current) is increased in the off state at the gate voltage of 0 V together with the increase in the scaling ratio k. As a result, when the N type polysilicon is used for the gate electrode, the off state cannot be maintained due to the leak current unless the gate drive circuit applies a negative voltage to the gate terminal. This becomes problematic when the temperature is high especially.

Meanwhile, according to an embodiment of the present invention, since the P type polysilicon is used, the resistance of the electrode material is increased to some extent, but as the scaling ratio k is increased, the gate charge (gate current) is reduced, so that the increase in the resistance of the electrode material does not matter. Furthermore, when the P type polysilicon is used, due to the negative built-in voltage, it becomes possible to reduce the leak current through the channel of the MOS structure (very small current due to electrons going through the N emitter, the P base surface, and N base). Especially, it becomes possible to reduce the leak current when the voltage VGE between the gate and the emitter is 0 V. As a result, a negative bias is not needed in driving the gate, so that the gate drive circuit can be simple. When the negative bias is not needed when the gate voltage is 5 V or less (or the scaling ratio k is 3 or more), the IC composed of the CMOS can be used for the gate drive circuit, so that the gate drive IC can be provided at low cost.

Furthermore, when each of the gate insulating films 4 and 5 is a high-permittivity gate insulating film made of an oxide of hafnium (Hf), zirconium (Zr), aluminum (Al), or a titanium, or a silicate compound of those, the leak current due to a tunneling current through the gate insulating film can be considerably reduced especially in a case where the scaling ratio k is 10 or more.

As described above, according to one or more embodiments of the present invention, it is possible to provide the high-voltage insulated gate type bipolar semiconductor device which needs only a short time to form the trench gate in the wafer, can make a suitable response to the thinned and large-diameter wafer, and improve mass productivity.

Furthermore, according to the manufacturing method for one or more embodiments of the present invention, the high-performance (low-loss) IGBT can be manufactured with the less steps and the high yield.

According to each of the first and second embodiments of the present invention, since the surface of the IGBT is thinned, it is possible to perform the process of the fine LSI at the same time as the process of the IGBT, and it is also possible to provide the control circuit of the IGBT on the same chip.

One or more embodiments of the present invention can be applied not only to the vertical type IGBT but also to a horizontal type IGBT used in a power IC.

Hereinbelow is explained a method for fabricating IGBT, in accordance with an embodiment of the present invention.

The method in accordance with the present embodiment is characterized in that a reference structure (scaling ratio K=1) of IGBT is prepared in advance, and IGBT is fabricated in comparison with the reference structure.

FIG. 11 is a flow chart showing steps to be carried out in the method.

IGBT to be fabricated by the method includes a low-concentration base layer 1 having a first conductivity type, a plurality of trenches 2 formed on a front surface of the low-concentration first conductivity type base layer 1, the trenches 2 being arranged such that adjacent trenches 2 are spaced away from each other alternately by a large interval and a small interval, a gate insulating film 4 formed on a surface of each of the trenches 2, a gate electrode 6 formed inside of the gate insulating film 4, a base layer 8 having a second conductivity type, the base layer 8 being formed between the adjacent trenches 2 spaced away from each other by the small interval, a high-concentration source layer 9 having a first conductivity type, the high-concentration source layer 9 being formed on a front surface of the second conductivity type base layer 8, a first main electrode (an emitter electrode) 10 electrically connecting to both the second conductivity type base layer 8 and the first conductivity type source layer 9, a MOS transistor formed on front surfaces of the first conductivity type source layer 9, the second conductivity type base layer 8, and the low-concentration first conductivity type base layer 1, a buffer layer 12 having a first conductivity type, the buffer layer 12 being formed on a back surface of the low-concentration first conductivity type base layer 1, and having an impurity concentration higher than the same of the low-concentration first conductivity type base layer 1, a high-concentration emitter layer 13 having a second conductivity type, the high-concentration emitter layer 13 being formed on a front surface of the first conductivity type buffer layer 12, and a second main electrode (a collector electrode) 14 formed on a front surface of the second conductivity type emitter layer 13.

The method in accordance with the present embodiment is distinguished from a conventional method for fabricating IGBT in the following steps.

Firstly, as illustrated in FIG. 11, a scaling ratio K is determined. Then, a width S of a mesa region in which the gate insulating film 4 and the MOS transistor are formed, and a depth $D_T$ of the trenches 2 are determined through the use of the scaling ratio K, as follows (Step 101).

$$S=R1/K$$

$$D_T=R2/K$$

R1: a second width of the reference structure,
R2: a second trench depth of the reference structure,
K: a scaling ratio defined as K=Y/X, wherein
X indicates a size of a target portion to be miniaturized in the high-voltage insulated gate type bipolar semiconductor device, and
Y indicates a size of a target portion to be miniaturized in the reference structure.

For instance, the scaling ratio K may be equal to or greater than three, or the scaling ratio K may be equal to or greater than five.

For instance, the second trench depth T of the reference structure may be set to have a depth in the range of 5 micrometers to 6 micrometers both inclusive (5 micrometers≤T≤6 micrometers).

Then, a cell width 2W of IGBT is set to be equal in length to a second length of the reference structure, which corresponds to a cell width in the reference structure (Step 102).

For instance, the cell width 2W of IGBT is designed to have a length in the range of 15 micrometers to 20 micrometers both inclusive (15 micrometers≤2W≤20 micrometers).

If necessary, the step (Step 103) of determining a film thickness Tox of the gate insulating film such that the scaling ratio K is equal to greater than three, and determining a voltage Vge with which a gate in the MOS transistor is driven is carried out.

$$Tox=(\text{a film thickness of a second gate insulating film of the reference structure})/K$$

$$Vge=V_A/K$$

wherein
$V_A$ indicates a voltage with which a second gate in the reference structure is driven, and
K indicates the scaling ratio used for determining the film thickness Tox.

A thickness Ta of the second conductivity type emitter layer 13 formed on a back surface of the low-concentration first type conductivity base layer 1 may be set to be equal to or greater than 10 nanometers, but equal to or smaller than 1 micrometer (10 nanometers≤Ta≤1 micrometer).

A gate electrode 6 in each of the trenches 2 may be formed to be P type polysilicon (Step 104).

Furthermore, the method in accordance with the present embodiment may further include forming the first conductivity type buffer layer 12 and the second conductivity type emitter layer 13 on a back surface of the low-concentration first conductivity type base layer 1 (Step 105), and subsequently to the previous step (Step 105) of forming the first conductivity type buffer layer 12 and the second conductivity type emitter layer 13, forming a surface structure including the trenches 2 and the MOS structure, on a back surface of the low-concentration first conductivity type base layer 1 (Step 106).

An interval between centers of the trenches located adjacent to each other in the reference structure, may be set to be in the range of 3 micrometers to 4 micrometers both inclusive, and setting the scaling ratio K to be equal to or greater than three in the case that the interval is in the range of 3 micrometers to 4 micrometers both inclusive.

Hereinbelow is explained a method for fabricating IGBT, in accordance with another embodiment of the present invention.

Similarly to the previous embodiment, the method in accordance with the present embodiment is characterized in that a reference structure (scaling ratio K=1) of IGBT is prepared in advance, and IGBT is fabricated in comparison with the reference structure.

Figure 12:
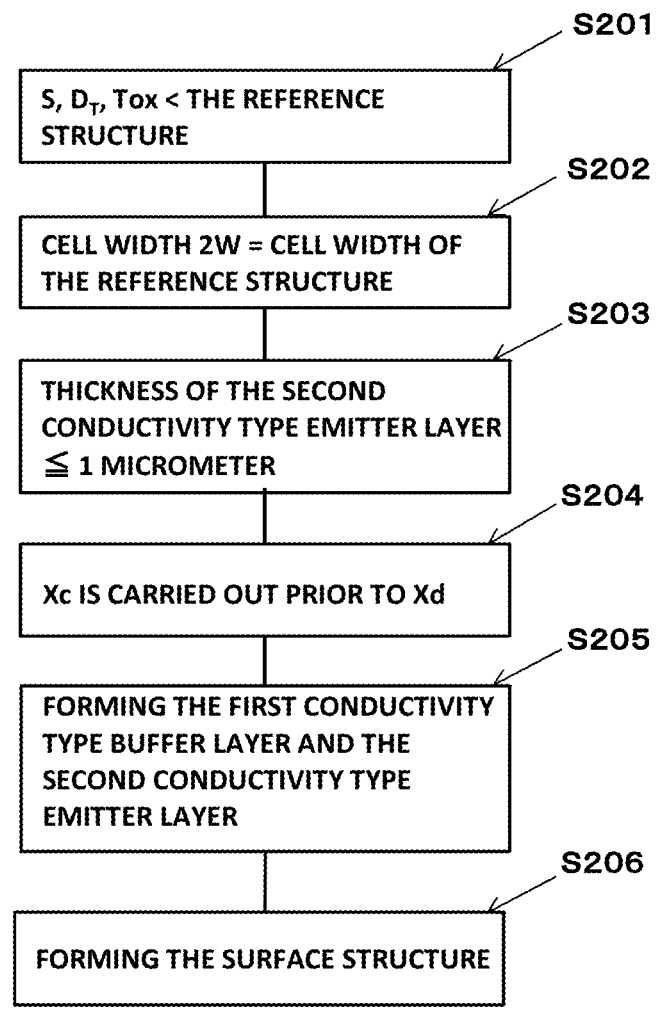
FIG. 12 illustrates a flow chart showing steps to be carried out in the method for fabricating IBGT, in accordance with another embodiment of the present invention.

FIG. 12 is a flow chart showing steps to be carried out in the method.

IGBT to be fabricated by the method includes a low-concentration base layer 1 having a first conductivity type, a plurality of trenches 2 formed on a front surface of the low-concentration first conductivity type base layer 1, the trenches 2 being arranged such that adjacent trenches 2 are spaced away from each other alternately by a large interval and a small interval, a gate insulating film 4 formed on a surface of each of the trenches 2, a gate electrode 6 formed inside of the gate insulating film 4, a base layer 8 having a second conductivity type, the base layer 8 being formed between the adjacent trenches 2 spaced away from each other by the small interval, a high-concentration source layer 9 having a first conductivity type, the high-concentration source layer 9 being formed on a front surface of the second conductivity type base layer 8, a first main electrode 10 electrically connecting to both the second conductivity type base layer 8 and the first conductivity type source layer 9, a MOS transistor formed on front surfaces of the first conductivity type source layer 9, the second conductivity type base layer 8, and the low-concentration first conductivity type base layer 1, a layer 11 having a second conductivity type and having a non-fixed potential, the layer 11 being formed between the adjacent trenches 2 spaced away from each other by the large interval such that the layer 11 is not electrically connected with the first main electrode (an emitter electrode) 10 or is electrically connected with the first main electrode 10 through a high resistance, the layer 11 having a depth almost equal to a depth of the trenches 2, a buffer layer 12 having a first conductivity type, the buffer layer 12 being formed on a back surface of the low-concentration first conductivity type base layer 1, and having an impurity concentration higher than the same of the low-concentration first conductivity type base layer 1, a high-concentration emitter layer 13 having a second conductivity type, the high-concentration emitter layer 13 being formed on a front surface of the first conductivity type buffer layer 12, and a second main electrode (a collector electrode) 14 formed on a front surface of the second conductivity type emitter layer 13.

The reference structure is varied in dependence on manufactures. For instance, a voltage Vge is 15V with which a gate is driven in IGBT having the reference structure, in the case that the trench depth Dt is in the range of 5 to 6 micrometers, the interval between adjacent trenches is in the range of 3 to 4 micrometers, the cell width 2W is in the range of 15 to 20 micrometers, and IGBT is in on-state condition.

A trench is not a stripe, but a square in some manufactures, and accordingly, the figures mentioned above should be replaced with an area ratio.

The method in accordance with the present embodiment is distinguished from a conventional method for fabricating IGBT in the following steps.

Then, an area ratio Sa:Sb is set to be in the range of 1:4 to 1:6 both inclusive, wherein Sa indicates, among areas surrounded by centers of the trenches 2, an area of the reference structure which does not make contact with a second emitter electrode of the reference structure or makes contact with the second emitter electrode through a high resistance, and Sb indicates, among areas surrounded by centers of the trenches 2, an area of the reference structure which makes contact with the second emitter electrode.

A voltage Vge with which a gate is driven is set in accordance with the equation:

$$Vge=V1/K$$

V1: a voltage with which the second gate in the reference structure is driven, the voltage V1 being equal to 15V in the case that the high-voltage insulated gate type bipolar semiconductor device having the reference structure is in an on-state condition, K: the scaling ratio being equal to or greater than three (Step S201).

The scaling ratio K may be equal to or greater than 3, but equal to or smaller than 5.

Then, the cell width 2W of IGBT is set equal to a cell width of the reference structure (Step S202).

The method may include the steps of setting the scaling ratio K to be equal to or greater than three, and setting Ra to be smaller than Rb.

Ra and Rb are defined as follows:

$$Ra=Ra1/Rat;$$

$$Rb=Rb1/Rb2,$$

wherein Ra1 indicates an average of impurity concentration gradient in the second conductivity type emitter layer 13, Rat indicates a total amount of an impurity in the second conductivity type emitter layer 13, Rb1 indicates an average of impurity concentration gradient in both the second conductivity type layer 11 having a non-fixed potential, and the second conductivity type base layer 8, and Rb2 indicates a total amount of an impurity in both the second conductivity type layer 11 having a non-fixed potential, and the second conductivity type base layer 8.

In the method in accordance with the present embodiment, a thickness of the second conductivity type emitter layer 13 is set to be equal to or smaller than 1 micrometer (Step 203).

If necessary, in the method in accordance with the present embodiment, the step Xc of implanting an impurity for forming the second conductivity type emitter layer 13 is carried out prior to the step Xd of implanting an impurity for forming the second conductivity type base layer 8 and the second conductivity type layer 11 having a non-fixed potential (Step 204).

For instance, a thickness Te of the second conductivity type emitter layer 13 formed on a back surface of the low-concentration first conductivity type base layer 1 is set to be equal to or smaller than 1 micrometer, but equal to or greater than 10 nanometers (1 micrometer≤Te≤10 nanometers).

If necessary, the method in accordance with the present embodiment may further include the step (Step 205) of forming both the first conductivity type buffer layer 12 and the second conductivity type emitter layer 13 on a back surface of the low-concentration first conductivity type base layer 1, and subsequently to the previous step (Step 205) of forming both the first conductivity type buffer layer 12 and the second conductivity type emitter layer 13, the step (Step 206) of forming a front surface structure including both the trenches 2 and the MOS transistor on a front surface of the low-concentration first conductivity type base layer.

The method in accordance with one or more embodiments of the present invention may be used for technology of manufacturing various semiconductors as well as IGBT, as a future miniaturization technology capable of responding to the large-diameter and thinned wafer.

EXPLANATION OF THE REFERENCE SIGNS

1: N base layer (low-concentration N type layer)
2, 3: Trench
4, 5: Gate insulating film
6, 7: Gate electrode (control electrode)
8: P base layer (P well layer)
9: N source layer
10: Emitter electrode (first main electrode)
11: P type layer having unfixed potential
12: N buffer layer
13: P emitter layer
14: Collector electrode (second main electrode)
20: Semiconductor substrate
30: Protection tape
40: Stage substrate

The invention claimed is:

1. A method for fabricating a high-voltage insulated gate type bipolar semiconductor device by comparing the high-voltage insulated gate type bipolar semiconductor device to a reference structure of the same type of device, the high-voltage insulated gate type bipolar semiconductor device comprising:

a low-concentration base layer having a first conductivity type;

a plurality of trenches formed on a front surface of the low-concentration first conductivity type base layer, the trenches being arranged such that adjacent trenches are spaced away from each other alternately by a large interval and a small interval;

a gate insulating film formed on a surface of each of the trenches;

a gate electrode formed inside of the gate insulating film;

a base layer having a second conductivity type, the base layer being formed between the adjacent trenches spaced away from each other by the small interval;

a high-concentration source layer having a first conductivity type, the high-concentration source layer being formed on a front surface of the second conductivity type base layer;

a first main electrode electrically connecting to both the second conductivity type base layer and the first conductivity type source layer;

a MOS transistor formed on front surfaces of the first conductivity type source layer, the second conductivity type base layer, and the low-concentration first conductivity type base layer;
a buffer layer having a first conductivity type, the buffer layer being formed on a back surface of the low-concentration first conductivity type base layer, and having an impurity concentration higher than the same of the low-concentration first conductivity type base layer;
a high-concentration emitter layer having a second conductivity type, the high-concentration emitter layer being formed on a front surface of the first conductivity type buffer layer; and
a second main electrode formed on a front surface of the second conductivity type emitter layer,
the method including:
determining a width S of a mesa region in which the gate insulating film and the MOS transistor are formed, and a trench depth DT of the plurality of trenches, wherein
S is equal to R1/K;
DT is equal to R2/K;
R1 is a width of a mesa region in the reference structure;
R2 is a depth of a trench in the reference structure; and
K is a scaling ratio defined as K=Y/X, wherein
X indicates a size of a target portion to be miniaturized in the high-voltage insulated gate type bipolar semiconductor device, and
Y indicates a size of a target portion to be miniaturized in the reference structure;
setting a cell width 2W of the high-voltage insulated gate type bipolar semiconductor device to be equal in length to a corresponding cell width of the reference structure;
setting the scaling ratio K to be equal to or greater than three; and
fabricating the high-voltage insulated gate type bipolar semiconductor device.

2. The method of claim 1, further comprising setting the cell width 2W to have a length in the range of 15 micrometers to 20 micrometers both inclusive.

3. The method of claim 1, further comprising setting the trench depth in the reference structure to have a depth in the range of 5 micrometers to 6 micrometers both inclusive.

4. The method of claim 1, further comprising:
determining a film thickness Tox of the gate insulating film such that the scaling ratio K is equal to greater than three, and $Tox=$(a film thickness of a second gate insulating film of the reference structure)$/K$ determining a voltage Vge with which a gate in the MOS transistor is driven, $Vge=VA/K$ wherein
VA indicates a voltage with which a second gate in the reference structure is driven, and
K indicates the scaling ratio used for determining the film thickness Tox.

5. The method of claim 1, further comprising setting a thickness of the second conductivity type emitter layer formed on a back surface of the low-concentration first type conductivity base layer, to be equal to or greater than 10 nanometers, but equal to or smaller than 1 micrometer.

6. The method of claim 1, further comprising forming a gate electrode in each of the trenches to be P type polysilicon.

7. The method of claim 6, further comprising setting the scaling ratio K to be equal to or greater than five.

8. The method of claim 6, further comprising setting the film thickness of the gate insulating film to be equal to or smaller than 20 nanometers.

9. The method of claim 5, further comprising:
forming the first conductivity type buffer layer and the second conductivity type emitter layer on a back surface of the low-concentration first conductivity type base layer; and
subsequently to the previous step of forming the first conductivity type buffer layer and the second conductivity type emitter layer, forming a surface structure including the trenches and the MOS structure, on a back surface of the low-concentration first conductivity type base layer.

10. The method of claim 1, further comprising:
setting an interval between centers of the trenches located adjacent to each other in the reference structure, to be in the range of 3 micrometers to 4 micrometers both inclusive; and
setting the scaling ratio K to be equal to or greater than three in the case that the interval is in the range of 3 micrometers to 4 micrometers both inclusive.

11. The method of claim 10, further comprising setting a voltage Vge with which a gate is driven, in accordance with the equation:

$Vge=V1/K$ wherein V1 is a voltage with which the second gate in the reference structure is driven, the voltage V1 being equal to 15V in the case that the high-voltage insulated gate type bipolar semiconductor device having the reference structure is in an on-state condition,
K is the scaling ratio being equal to or greater than three.

12. The method of claim 1, further comprising setting the scaling ratio K to be equal to or greater than five.

13. The method of claim 1, further comprising setting a thickness of the second conductivity type emitter layer formed on a back surface of the low-concentration first conductivity type base layer, to be equal to or smaller than 1 micrometer, but equal to or greater than 10 nanometers.

14. The method of claim 1, wherein a step of implanting an impurity for forming the second conductivity type emitter layer is carried out prior to the step of implanting an impurity for forming the second conductivity type base layer and the second conductivity type layer having a non-fixed potential.

15. The method of claim 1, further comprising:
forming both the first conductivity type buffer layer and the second conductivity type emitter layer on a back surface of the low-concentration first conductivity type base layer, and
after forming both the first conductivity type buffer layer and the second conductivity type emitter layer, forming a front surface structure including both the trenches and the MOS transistor on a front surface of the low-concentration first conductivity type base layer.

16. A method for fabricating a high-voltage insulated gate type bipolar semiconductor device by comparing the high-voltage insulated gate type bipolar semiconductor device to a reference structure of the same type of device, the high-voltage insulated gate type bipolar semiconductor device comprising:

a low-concentration base layer having a first conductivity type;

a plurality of trenches formed on a front surface of the low-concentration first conductivity type base layer, the trenches being arranged such that adjacent trenches are spaced away from each other alternately by a large interval and a small interval;

a gate insulating film formed on a surface of each of the trenches;

a gate electrode formed inside of the gate insulating film;

a base layer having a second conductivity type, the base layer being formed between the adjacent trenches spaced away from each other by the small interval;

a high-concentration source layer having a first conductivity type, the high-concentration source layer being formed on a front surface of the second conductivity type base layer;

an emitter electrode electrically connecting to both the second conductivity type base layer and the first conductivity type source layer;

a MOS transistor formed on front surfaces of the first conductivity type source layer, the second conductivity type base layer, and the low-concentration first conductivity type base layer;

a layer having a second conductivity type and having a non-fixed potential, the layer being formed between the adjacent trenches spaced away from each other by the large interval such that the layer is not electrically connected with the emitter electrode or is electrically connected with the emitter electrode through a high resistance, the layer having a depth almost equal to a depth of the trenches;

a buffer layer having a first conductivity type, the buffer layer being formed on a back surface of the low-concentration first conductivity type base layer, and having an impurity concentration higher than the same of the low-concentration first conductivity type base layer;

a high-concentration emitter layer having a second conductivity type, the high-concentration emitter layer being formed on a front surface of the first conductivity type buffer layer; and a collector electrode formed on a front surface of the second conductivity type emitter layer, the method comprising:

setting a width S of a mesa region in which the gate insulating film and the MOS transistor are formed, a trench depth DT of the plurality of trenches, and a film thickness Tox of the gate insulating film to be smaller than C1/K, C2/K and C3/K, respectively, wherein C1 indicates a width of a mesa region in the reference structure, C2 indicates a depth of a trench in the reference structure, C3 indicates a film thickness of a second gate insulating film in the reference structure, and K indicates a scaling ratio K being defined as K=Y/X, wherein X indicates a size of a target portion to be miniaturized in the high-voltage insulated gate type bipolar semiconductor device, and Y indicates a size of a target portion to be miniaturized in the reference structure;

setting a cell width 2W of the high-voltage insulated gate type bipolar semiconductor device to be equal in length to a cell width of the reference structure;

setting the scaling ratio K to be equal to or greater than three; and fabricating the high-voltage insulated gate type bipolar semiconductor device.

17. A method for fabricating a high-voltage insulated gate type bipolar semiconductor device by comparing the high-voltage insulated gate type bipolar semiconductor device to a reference structure of the same type of device, the method comprising:

determining a width S of a mesa region of the high-voltage insulated gate type bipolar semiconductor device, and a trench depth DT of the high-voltage insulated gate type bipolar semiconductor device, wherein S is equal to R1/K;

DT is equal to R2/K;

R1 is a width of a mesa region in the reference structure;

R2 is a depth of a trench in the reference structure; and

K is a scaling ratio defined as K=Y/X, wherein

X indicates a size of a target portion to be miniaturized in the high-voltage insulated gate type bipolar semiconductor device, and Y indicates a size of a target portion to be miniaturized in the reference structure;

setting a cell width 2W of the high-voltage insulated gate type bipolar semiconductor device to be equal in length to a corresponding cell width of the reference structure;

setting the scaling ratio K to be equal to or greater than three; and fabricating the high-voltage insulated gate type bipolar semiconductor device.

* * * * *